(12) United States Patent
Xue et al.

(10) Patent No.: US 12,342,713 B2
(45) Date of Patent: Jun. 24, 2025

(54) FLEXIBLE DISPLAY PANEL HAVING A BENDING AREA LOCATED BETWEEN A DISPLAY AREA AND A BONDING AREA AND MANUFACTURING METHOD THEREFOR, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Longhui Xue, Beijing (CN); Weiyun Huang, Beijing (CN); Wei Zhang, Beijing (CN); Mingqiang Wang, Beijing (CN); Quan Shi, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 517 days.

(21) Appl. No.: 17/779,385

(22) PCT Filed: May 28, 2021

(86) PCT No.: PCT/CN2021/096873
§ 371 (c)(1),
(2) Date: May 24, 2022

(87) PCT Pub. No.: WO2021/239127
PCT Pub. Date: Dec. 2, 2021

(65) Prior Publication Data
US 2022/0406880 A1    Dec. 22, 2022

(30) Foreign Application Priority Data

May 29, 2020 (CN) .......................... 202010473799.1

(51) Int. Cl.
*H10K 77/10* (2023.01)
*H10K 50/844* (2023.01)
(Continued)

(52) U.S. Cl.
CPC ......... *H10K 77/111* (2023.02); *H10K 50/844* (2023.02); *H10K 59/1213* (2023.02);
(Continued)

(58) Field of Classification Search
CPC ............. H10K 50/844; H10K 59/1213; H10K 59/1315; H10K 59/131; H10K 77/111; H10K 2102/311; G09F 9/301
See application file for complete search history.

(56) References Cited

U.S. PATENT DOCUMENTS 11,081,059 B2 * 8/2021 Chang .................... G02F 1/1345
11,088,345 B2 * 8/2021 Zhao .................... H10K 59/8731
(Continued)

FOREIGN PATENT DOCUMENTS

CN    106972030 A    7/2017
CN    107180595 A    9/2017
(Continued)

OTHER PUBLICATIONS

Office Action for the Chinese Patent Application No. 202010473799.1 issued by the Chinese Patent Office on Sep. 15, 2022.

*Primary Examiner* — Khiem D Nguyen
(74) *Attorney, Agent, or Firm* — XSENSUS LLP

(57) ABSTRACT

A flexible display panel has a display area, a bonding area, and a bending area located between the display area and the bonding area. A flexible substrate includes a first surface and a second surface. Signal leads electrically connected to pixel driving circuits pass through the bending area from the display area and extend to the bonding area. In the pixel driving circuits, at least one pattern layer made of an
(Continued)

inorganic material and located between the signal leads and the flexible substrate passes through the bending area from the display area and extends to the bonding area. A second organic material layer is disposed on a side of the signal leads away from the first surface and located at the bending area. A groove is disposed in a film layer away from the signal leads, and is located between the display area and the bonding area.

17 Claims, 8 Drawing Sheets

(51) Int. Cl.
    *H10K 59/121*     (2023.01)
    *H10K 59/131*     (2023.01)
    *H10K 59/80*     (2023.01)
    *H10K 59/12*     (2023.01)
    *H10K 71/00*     (2023.01)
    *H10K 102/00*     (2023.01)

(52) U.S. Cl.
    CPC ....... *H10K 59/131* (2023.02); *H10K 59/1315* (2023.02); *H10K 59/873* (2023.02); *H10K 59/1201* (2023.02); *H10K 71/00* (2023.02); *H10K 2102/311* (2023.02)

(56) References Cited

U.S. PATENT DOCUMENTS

| | | | |
|---|---|---|---|
| 11,233,221 B2* | 1/2022 | Wang | H10K 77/10 |
| 11,362,114 B2* | 6/2022 | Yang | H01L 27/1248 |
| 11,588,131 B2* | 2/2023 | Rao | H05K 1/189 |
| 2017/0263887 A1* | 9/2017 | Han | H10K 50/844 |
| 2018/0090702 A1* | 3/2018 | Um | H10K 71/00 |
| 2019/0157590 A1 | 5/2019 | Um et al. | |
| 2019/0280248 A1 | 9/2019 | Kwon et al. | |
| 2019/0287433 A1 | 9/2019 | Huang et al. | |
| 2021/0336163 A1* | 10/2021 | Bai | G09F 9/33 |
| 2022/0359637 A1 | 11/2022 | Zhao et al. | |

FOREIGN PATENT DOCUMENTS

| | | |
|---|---|---|
| CN | 107887338 A | 4/2018 |
| CN | 109817675 A | 5/2019 |
| CN | 111599845 A | 8/2020 |
| CN | 111785758 A | 10/2020 |

* cited by examiner

FLEXIBLE DISPLAY PANEL HAVING A BENDING AREA LOCATED BETWEEN A DISPLAY AREA AND A BONDING AREA AND MANUFACTURING METHOD THEREFOR, AND DISPLAY DEVICE

CROSS-REFERENCE TO RELATED APPLICATIONS

This application is a national phase entry under 35 USC 371 of International Patent Application No. PCT/CN 2021/096873 filed on May 28, 2021, which claims priority to Chinese Patent Application No. 202010473799.1, filed on May 29, 2020, which are incorporated herein by reference in their entirety.

TECHNICAL FIELD

The present disclosure relates to the field of display technologies, and in particular, to a flexible display panel and a manufacturing method therefor, and a display device.

BACKGROUND

With the rapid development of display technologies, people have increasingly high requirements for using display devices, such as narrow bezel, portability, high color saturation of images, and power saving. Due to the characteristics of bendable folding, narrow bezel, lightness and thinness, and high contrast, organic light-emitting diode (OLED) display panels, quantum dot light-emitting diode (QLED) display panels and micro light-emitting diode (Micro LED) display panels are increasingly applied to display devices, and become a current mainstream development trend.

SUMMARY

In an aspect, a flexible display panel is provided. The flexible display panel has a display area, a bonding area, and a bending area located between the display area and the bonding area. The flexible display panel includes a flexible substrate, pixel driving circuits, a second organic material layer and a groove. The flexible substrate includes a first surface and a second surface arranged opposite to each other. Pixel driving circuits are located on the first surface, and signal leads electrically connected to the pixel driving circuits pass through the bending area from the display area and extend to the bonding area. In the pixel driving circuits, at least one pattern layer made of an inorganic material and located between the signal leads and the flexible substrate passes through the bending area from the display area and extends to the bonding area. The second organic material layer is disposed on a side of the signal leads away from the first surface and located at the bending area. The groove is disposed in a film layer away from the signal leads and located on a side where the second surface is located, and is located between the display area and the bonding area. A ratio of a thickness of the second organic material layer to a distance between a bottom of the groove and the first surface of the flexible substrate is in a range of 1:1 to 7:1, inclusive.

In some embodiments, the groove is disposed in the second surface, and the distance between the bottom of the groove and the first surface of the flexible substrate is less than a thickness of a portion of the flexible substrate located in the display area.

In some embodiments, the flexible display panel further includes a back film disposed on the second surface of the flexible substrate. The groove is disposed in a side surface of the back film away from the flexible substrate, penetrates through a portion of the back film located at the bending area, and does not penetrate through a portion of the flexible substrate located at the bending area. The distance between the bottom of the groove and the first surface of the flexible substrate is less than a thickness of a portion of the flexible substrate located in the display area.

In some embodiments, the flexible display panel further includes a back film disposed on the second surface of the flexible substrate. The groove is disposed in a side surface of the back film away from the flexible substrate, and does not penetrate through a portion of the back film located at the bending area.

In some embodiments, the groove further includes two opposite side surfaces, and an included angle between each of at least one of the two opposite side surfaces and the bottom of the groove is greater than or equal to 90 degrees.

In some embodiments, the groove further includes two opposite side surfaces, and an included angle between each of at least one of the two opposite side surfaces and the bottom of the groove is a rounded angle.

In some embodiments, a radius of the rounded angle is 250 to 600 microns.

In some embodiments, the flexible substrate includes a first flexible substrate, a second flexible substrate and a third flexible substrate that are stacked. The first surface of the flexible substrate is a side surface of the first flexible substrate away from the second flexible substrate, and the second surface of the flexible substrate is a side surface of the third flexible substrate away from the second flexible substrate. The distance between the bottom of the groove and the first surface of the flexible substrate is less than or equal to a thickness of a portion of the first flexible substrate located in the display area. The first flexible substrate and the third flexible substrate are each made of an organic material, and the second flexible substrate is made of an inorganic material.

In some embodiments, a thickness of the first flexible substrate is less than a thickness of the third flexible substrate.

In some embodiments, the flexible substrate includes a first flexible substrate, a second flexible substrate and a third flexible substrate that are stacked. The first surface of the flexible substrate is a side surface of the first flexible substrate away from the second flexible substrate, and the second surface of the flexible substrate is a side surface of the third flexible substrate away from the second flexible substrate. The first flexible substrate and the third flexible substrate are each made of an organic material, and the second flexible substrate is made of an inorganic material.

In some embodiments, the flexible display panel further includes a first organic material layer. The first organic material layer includes at least one of a first planarization layer, a second planarization layer, a pixel defining layer or an organic encapsulation film that are sequentially away from the first surface of the flexible substrate. The second organic material layer includes a cover layer, and at least one pattern layer in the cover layer and a corresponding pattern layer in the first organic material layer are in a same layer, and made of a same material.

In some embodiments, the second organic material layer further includes an anti-bending layer located on a side of the cover layer away from the flexible substrate. A material of the anti-bending layer includes at least one of a polyimide material, an optically clear adhesive, an acrylic adhesive, a UV curable adhesive or a photoresist.

In some embodiments, the material of the anti-bending layer includes the polyimide material.

In some embodiments, the second organic material layer further includes an anti-bending layer located on a side of the cover layer away from the flexible substrate. An included angle between a side surface of the anti-bending layer and a surface of the anti-bending layer proximate to the flexible substrate is greater than or equal to 20 degrees and less than 90 degrees.

In some embodiments, an included angle between the side surface of the anti-bending layer and a surface of the anti-bending layer away from the flexible substrate is a rounded angle.

In another aspect, a display device is provided. The display device includes the flexible display panel in any one of the above embodiments.

In yet another aspect, a manufacturing method of a flexible display panel is provided, and the flexible display panel is the above flexible display panel. The manufacturing method includes: forming the pixel driving circuits and the signal leads electrically connected to the pixel driving circuits on the first surface of the flexible substrate, the signal leads passing through the bending area from the display area and extending to the bonding area, and in the pixel driving circuits, at least one pattern layer made of an inorganic material and located between the signal leads and the flexible substrate passing through the bending area from the display area and extending to the bonding area; forming the second organic material layer on the first surface of the flexible substrate, the second organic material layer being disposed on the side of the signal leads away from the first surface and located at the bending area; and forming the groove in the film layer away from the signal leads and located on the side where the second surface is located, the groove being located between the display area and the bonding area. The ratio of the thickness of the second organic material layer to the distance between the bottom of the groove and the first surface of the flexible substrate is in the range of 1:1 to 7:1, inclusive.

In some embodiments, the manufacturing method of the flexible display panel further includes: forming a back film on the second surface of the flexible substrate. In this case, forming the groove in the film layer away from the signal leads and located on the side where the second surface is located, includes: forming the groove in the back film. The groove penetrates through a portion of the back film located at the bending area, and does not penetrate through a portion of the flexible substrate located at the bending area, or the groove does not penetrate through the portion of the back film located at the bending area.

In some embodiments, in a case where the flexible display panel further includes the first organic material layer, the second organic material layer includes a cover layer, and at least one pattern layer in the cover layer and a corresponding pattern layer in the first organic material layer are in a same layer and made of a same material, forming the second organic material layer on the first surface of the flexible substrate, includes: forming the at least one pattern layer in the cover layer and the corresponding pattern layer in the first organic material layer on the first surface of the flexible substrate through one patterning process.

In some embodiments, in a case where the second organic material layer further includes the anti-bending layer, forming the second organic material layer on the first surface of the flexible substrate further, includes: forming the anti-bending layer on a surface of the cover layer away from the flexible substrate. An included angle between a side surface of the anti-bending layer and a surface of the anti-bending layer proximate to the flexible substrate is greater than or equal to 20 degrees and less than 90 degrees.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method, and an actual timing of a signal involved in the embodiments of the present disclosure.

DETAILED DESCRIPTION

Figure 1:
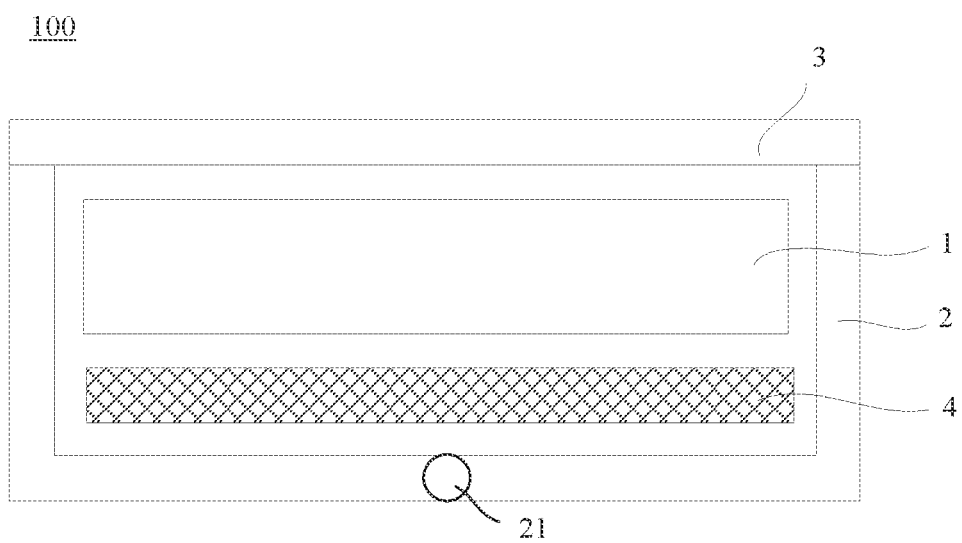
FIG. 1 is a structural diagram of a display device, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled," "connected," and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C. The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

As shown in FIG. 1, some embodiments of the present disclosure provide a display device 100. The display device 100 includes a flexible display panel 1, a frame 2, a cover plate 3, a circuit board 4, a driving chip (i.e., integrated circuit chip, IC) (not shown in FIG. 1) and other electronic accessories. For example, the display device 100 may be a mobile phone, a tablet computer, a notebook computer, a personal digital assistant (PDA), or a vehicle-mounted computer. A specific form of the display device 100 is not particularly limited in the embodiments of the present disclosure.

A longitudinal section of the frame 2 is U-shaped, and the flexible display panel 1, the circuit board 4 and other electronic accessories are all disposed in the frame 2. The circuit board 4 is disposed below the flexible display panel 1, and the cover plate 3 is disposed on a side of the flexible display panel 1 away from the circuit board 4.

The cover plate 3 may be rigid or flexible. In a case where the cover plate 3 is rigid, a constituent material of the cover plate 3 may be glass. In a case where the cover plate 3 is flexible, the constituent material of the cover plate 3 may be polyimide (PI), and in this case, the frame 2 is a foldable frame. As shown in FIG. 1, the foldable frame 2 has a rotation shaft 21, so that the display device 100 may be folded along the rotation shaft 21.

The display device 100 may be an organic light-emitting diode (OLED) display device, and in this case, the flexible display panel 1 is an OLED display panel. The display device 100 may also be a quantum dot light-emitting diode (QLED) display device, and in this case, the flexible display panel 1 is a QLED display panel. The circuit board 4 is, for example, a flexible printed circuit (FPC). For the convenience of description, in following embodiments, as an example, the display device 100 is the OLED display device, and the circuit board 4 is the FPC for explanation.

Figure 2:
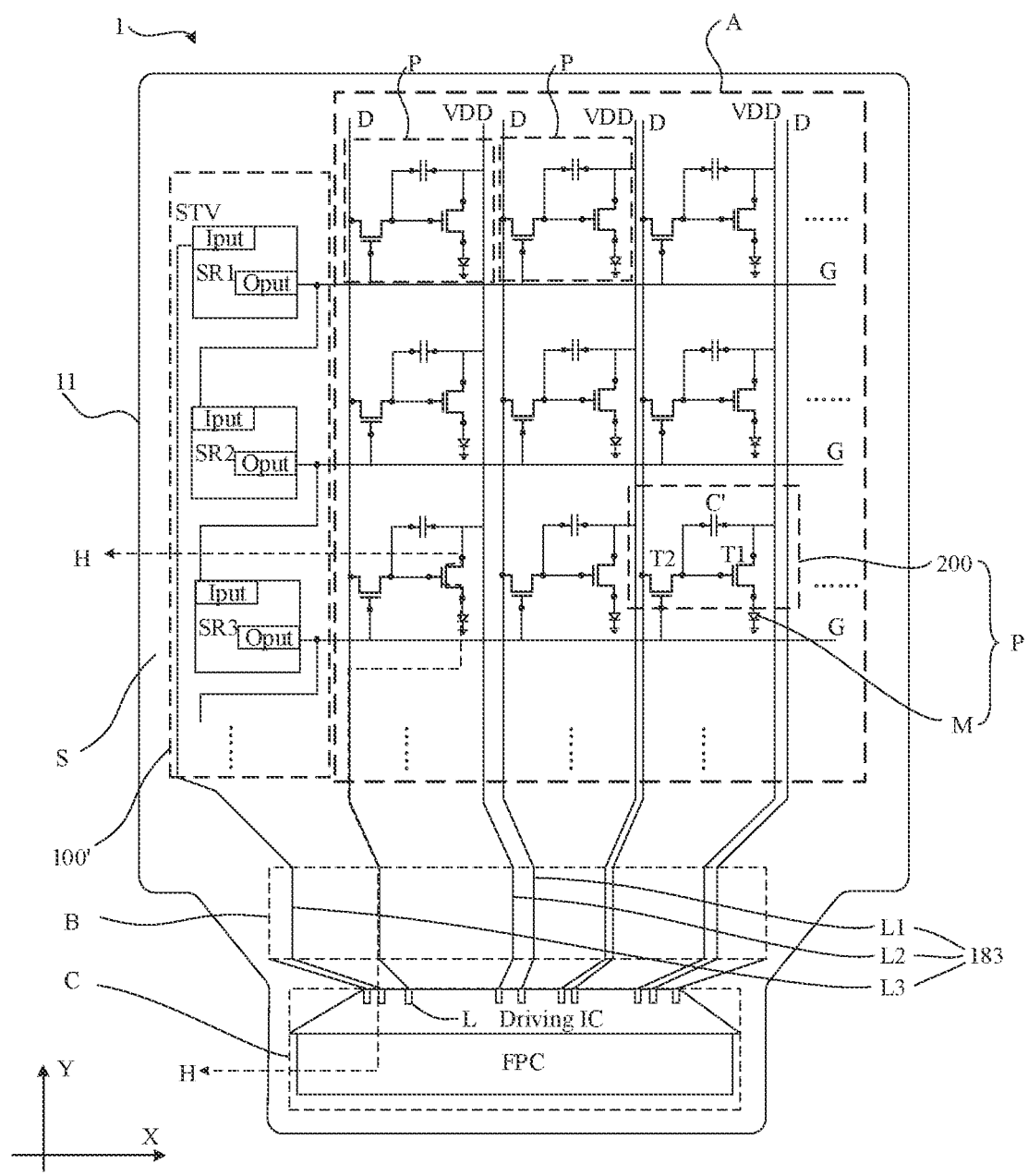
FIG. 2 is a plan view of a flexible display panel, in accordance with some embodiments.

A structure of the flexible display panel 1 will be exemplified below. As shown in FIG. 2, when a display surface of the flexible display panel 1 is observed, it can be seen that the flexible display panel 1 has a display area A and a peripheral area S located on at least one side of the display area A. FIG. 2 exemplarily illustrates that the peripheral area S surrounds the display area A.

A plurality of sub-pixels P are provided in the display area A. For the convenience of description, as an example, the plurality of sub-pixels P are arranged in a matrix for description. Sub-pixels P arranged in a line in a horizontal direction X are referred to as a same row of sub-pixels, and sub-pixels P arranged in a line in a vertical direction Y are referred to as a same column of sub-pixels. As shown in FIG. 2, each sub-pixel P includes a pixel driving circuit 200 and a light-emitting device M electrically connected to the pixel driving circuit 200. The pixel driving circuit 200 is able to drive the light-emitting device M electrically connected thereto to emit light. In this case, light-emitting devices M in the plurality of sub-pixels P may emit at least three primary colors of light, such as red (R) light, green (G) light and blue (B) light.

As shown in FIG. 2, a gate driving circuit 100' located on at least one side of the display area A is provided in the peripheral area S. FIG. 2 exemplarily illustrates that the gate driving circuit 100' is located on a left side of the display area A. The gate driving circuit 100' is configured to transmit gate driving signals to pixel driving circuits 200 in the plurality of sub-pixels P row by row.

As shown in FIG. 2, the peripheral area S includes a bonding area C and a bending area B located between the display area A and the bonding area C. As shown in FIG. 2, in an example where the display device 100 is a mobile phone, the bonding area C and the bending area B are disposed on a side of the display area A. For example, the bonding area C and the bending area B are located in the peripheral area S and on a lower side of the display area A.

The FPC (i.e., the circuit board 4) and the driving IC located on the FPC in the display device 100 are disposed in the bonding area C. The driving IC and/or the FPC may provide driving signals to the gate driving circuit 100' located in the peripheral area S, may provide data signals to data lines D located in the display area A, and may provide voltage signals to voltage signal lines VDD located in the display area A. The bending area B is used for bending the flexible display panel 1, so that the driving IC and the FPC disposed in the bonding area C are located on a non-light exit side (referred to as a back side below) of the flexible display panel 1, thereby realizing a narrow bezel of the display device 100.

As shown in FIG. 2, the flexible display panel 1 includes a flexible substrate 11 and a plurality of connectors L disposed on the flexible substrate 11 and located in the bonding area C. The connector L may include various forms. For example, the connector L is a pad. For another example, the connector L is a pin. The plurality of connectors L are electrically connected to the driving IC and/or the FPC, and the plurality of connectors L are also respectively electrically connected to the data lines D through respective first signal leads L1, are respectively electrically connected to the voltage signal lines VDD through respective second signal leads L2, and are electrically connected to the gate driving circuit 100' through respective third signal leads L3.

The first signal lead L1 is located between the display area A and a corresponding connector L, the second signal lead L2 is located between the display area A and a corresponding connector L, and the third signal lead L3 is located between the gate driving circuit 100' and a corresponding connector L.

For the convenience of description below, as shown in FIG. 2, the first signal leads L1, the second signal leads L2 and the third signal leads L3 electrically connected to the plurality of connectors L are collectively referred to as signal leads 183. In order to simplify a process, the first signal leads L1, the second signal leads L2 and the third signal leads L3 that form the signal leads 183 may be formed of a same material in a same layer by using a same patterning process. A typical patterning process is to apply a mask once to form desired pattern(s) through a process, and the process includes: coating a photoresist on a surface of a film, exposing the photoresist, developing the photoresist after exposure, etching a region of the film exposed by the photoresist to form specific pattern(s), and removing the photoresist.

The plurality of connectors L are disposed in the flexible display panel 1, and an end of each of the plurality of connectors L is electrically connected to the driving IC and/or the FPC, and another end of each of the plurality of connectors L is electrically connected to a signal lead 183, so that the driving signals, the voltage signals and the data signals provided by the driving IC and/or the FPC are able to be indirectly or directly transmitted to the pixel driving circuits 200 through the signal leads 183. The pixel driving circuit 200 drives the light-emitting device M electrically connected thereto to emit light under a combined action of the gate driving signal, the data signal and the voltage signal, thereby displaying image(s).

Figure 3:
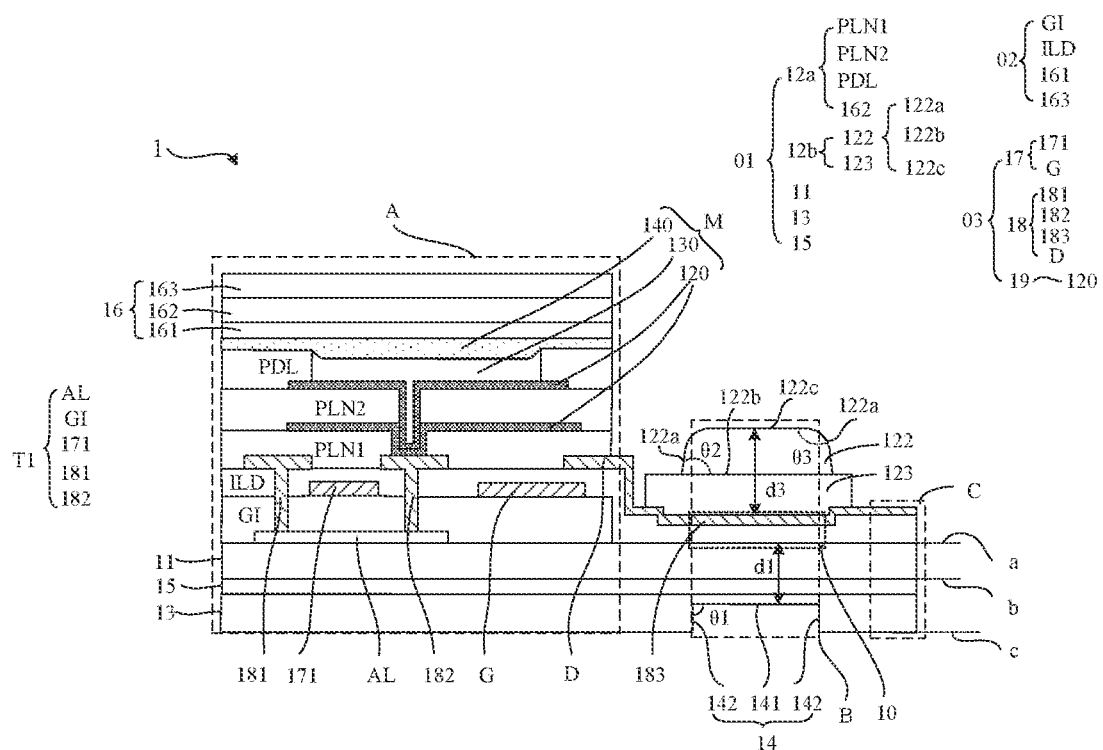
FIG. 3 is a sectional view of the flexible display panel shown in FIG. 2 taken along the H-H line.

FIG. 3 is a sectional view of the flexible display panel 1 shown in FIG. 2 taken along the H-H line, and FIG. 3 exemplarily illustrates that the bonding area C, the bending area B and a sub-pixel in the display area A are cut along the H-H line. As shown in FIG. 3, the flexible display panel 1 includes the flexible substrate 11. The flexible substrate 11 may be of a single-layer structure or a multi-layer structure. Hereinafter, unless otherwise specified, a description will be made in an example where the flexible substrate 11 is of the single-layer structure. In a case where the flexible substrate 11 is of the single-layer structure, for example, a constituent material of the flexible substrate 11 may be one or more of polyimide (PI), polyethylene terephthalate (PET), and polyethylene naphthalate two formic acid glycol ester (PEN).

The flexible substrate 11 includes a first surface a and a second surface b that are arranged opposite to each other. A back film 13 is provided on a side of the flexible substrate 11 where the second surface b is located. The back film 13 is adhered to the second surface b of the flexible substrate 11 through an adhesive layer 15, and the back film 13 is able to support the flexible display panel 1. For example, a constituent material of the back film 13 may be one or more of polyimide (PI), polyethylene terephthalate (PET), polyolefin (PO), polymethyl methacrylate (PMMA). For example, a constituent material of the adhesive layer 15 may be an ultraviolet (UV) curable adhesive or a photoresist.

The pixel driving circuits 200 and the light-emitting devices M respectively electrically connected to the pixel driving circuits 200 are manufactured on the first surface a of the flexible substrate 11. The pixel driving circuit 200 includes a plurality of thin film transistors and at least one capacitor C' (FIG. 2 illustrates pixel driving circuits each having a 2T1C structure, and FIG. 3 illustrates a connection relationship between a thin film transistor and a light-emitting device M).

Each thin film transistor may have a top-gate structure, a bottom-gate structure, or a dual-gate structure. As shown in FIG. 3, the thin film transistor has a top-gate structure, and includes an active layer AL, a gate insulating layer GI, a gate 171, and a source-drain electrode (including a source 181 and a drain 182) that are sequentially stacked on the first surface a of the flexible substrate 11. The pixel driving circuits 200 in the plurality of sub-pixels P include an interlayer dielectric layer ILD disposed between gates and source-drain electrodes of thin film transistors in these pixel driving circuits 200. Via holes are formed in the gate insulating layer GI and the interlayer dielectric layer ILD, so that the source 181 and the drain 182 are able to be electrically connected to the active layer AL through the via holes.

The active layer AL of the thin film transistor may be formed of amorphous silicon, monocrystalline silicon, polycrystalline silicon or oxide semiconductor. The active layer AL includes a channel region doped without an impurity, and a source region and a drain region respectively located on two sides of the channel region and formed by doping an impurity. The doped impurity varies with a type of the thin film transistor, and may be an N-type impurity or a P-type impurity.

The capacitor C' includes a first electrode plate and a second electrode plate, and the interlayer dielectric layer ILD is disposed between the two electrode plates as a dielectric.

As shown in FIG. 2, considering the 2T1C structure in which the pixel driving circuit 200 includes two thin film transistors (i.e., a switching thin film transistor T2 and a driving thin film transistor T1) and a capacitor C' as an example, electrical connection relationships between the inside and the outside of the pixel driving circuit 200 will be described.

Agate 171 of the switching thin film transistor T2 is connected to a gate line G, a source 181 of the switching thin film transistor T2 is connected to a data line D, and a drain 182 of the switching thin film transistor T2 is connected to a gate 171 of the driving thin film transistor T1. A source 181 of the driving thin film transistor T1 is connected to a voltage signal line VDD, and a drain 182 of the driving thin film transistor T1 is connected to anode(s) 120 of the light-emitting device M through a via hole. The first plate of the capacitor C' is connected to the gate 171 of the driving thin film transistor T1, and the second plate of the capacitor C' is connected to the source 181 of the driving thin film transistor T1.

The switching thin film transistor T2 is turned on by a gate voltage applied to the gate line G, so that a data voltage applied to the data line D is transmitted to the driving thin film transistor T1. The data voltage transmitted to the driving thin film transistor T1 through the switching thin film transistor T2 and a common voltage applied to the driving thin film transistor T1 from the voltage signal line VDD have a certain difference therebetween. A voltage corresponding to an absolute value of the difference is stored in the capacitor C', and a current corresponding to the voltage stored in the capacitor C' flows into the light-emitting device M through the driving thin film transistor T1 to cause the light-emitting device M to emit light.

As shown in FIG. 3, the light-emitting device M includes the anode(s) 120, a light-emitting functional layer 130 and a cathode 140. The anode(s) 120 inject holes into the light-emitting functional layer 130, and the cathode 140 injects electrons into the light-emitting functional layer 130. When excitons generated by a combination of the holes and the electrons transition from an excited state to a ground state, the light emission occurs.

The anode(s) 120 may be formed of a metal with a high reflectivity, and the cathode 140 may be formed of a transparent conductive film. In this case, light from the light-emitting functional layer 130 is reflected by the anode(s) 120, and passes through the cathode 140 and reaches the outside, and thus a top-emission light-emitting device is formed, but is not limited thereto. In a case where the anode(s) 120 are formed of a transparent conductive film, and the cathode 140 is formed of a metal with a high reflectivity, a bottom-emission light-emitting device may be formed. Of course, in a case where the anode(s) 120 and the cathode 140 are formed of a transparent conductive film, a double-sided emission light-emitting device may be formed.

The transparent conductive film may be made of a metal oxide, such as an indium tin oxide (ITO), an indium zinc oxide (IZO) or an indium gallium zinc oxide (IGZO). The metal with a high reflectivity may be, for example, an alloy such as a magnesium aluminum alloy (MgAl) or a lithium aluminum alloy (LiAl), or a simple metal such as magnesium (Mg), aluminum (Al), lithium (Li), or silver (Ag). In addition, these metal materials further have characteristics of high conductivity and low work function. The light-emitting device M shown in FIG. 3 is a top-emission light-emitting device in which the anode(s) 120 are formed of a metal with a high reflectivity, and the cathode 140 is formed of a transparent metal oxide.

In some embodiments, the light-emitting functional layer 130 includes a light-emitting layer. In some other embodiments, the light-emitting functional layer 130 includes one or more of a hole injection layer (HIL), a hole transport layer (HTL), an election transport layer (ETL), and an election injection layer (EIL) in addition to the light-emitting layer.

As shown in FIG. 3, the flexible display panel 1 further includes a first planarization layer PLN1 and a second planarization layer PLN2 that are disposed between the thin film transistors in the pixel driving circuits 200 and light-emitting functional layers 130 of the light-emitting devices M, and a pixel defining layer PDL disposed on a side of anodes 120 of the light-emitting devices M away from the flexible substrate 11.

The first planarization layer PLN1 and the second planarization layer PLN2 are each made of an organic material. Materials for manufacturing the first planarization layer PLN1 and the second planarization layer PLN2 have fluidity, so that a surface of the flexible substrate on which the pixel driving circuits 200 are manufactured is able to be kept flat, which facilitates a subsequent manufacturing of the light-emitting devices M. The first planarization layer PLN1 and the second planarization layer PLN2 may be made of the same or different materials, and may have the same or different thicknesses.

In a case where the flexible display panel 1 includes the first planarization layer PLN1 and the second planarization layer PLN2, the light-emitting device M includes two anodes 120. The first planarization layer PLN1 has a via hole, and an anode 120 closer to the flexible substrate 11 in the two anodes 120 is electrically connected to the drain 182 through the via hole. The second planarization layer PLN2 also has a via hole, and another anode 120 farther from the flexible substrate 11 in the two anodes 120 is electrically connected to the anode 120 closer to the flexible substrate 11 through the via hole, but is not limited thereto. In some embodiments, the flexible display panel 1 has only one planarization layer.

The pixel defining layer PDL includes a plurality of opening regions and a dam arranged around each opening region. A light-emitting device M is disposed in an opening region. Anode(s) 120 of a light-emitting device M are separated from anode(s) 120 of an adjacent light-emitting device M by the dam of the pixel defining layer PDL, and a light-emitting layer in a light-emitting functional layer 130 of a light-emitting device M is separated from a light-emitting layer in a light-emitting functional layer 130 of an adjacent light-emitting device M by the dam of the pixel defining layer PDL. Cathodes 140 of the light-emitting devices M are connected into a whole. That is, the cathodes 140 are formed into a whole layer. Hole injection layers in the light-emitting functional layers 130 may be separated from each other by the dam of the pixel defining layer PDL, or may be formed into a whole layer. Hole transport layers in the light-emitting functional layers 130 may be separated from each other by the dam of the pixel defining layer PDL, or may be formed into a whole layer. Electron transport layers in the light-emitting functional layers 130 may be separated from each other by the dam of the pixel defining layer PDL, or may be formed into a whole layer. Electron injection layers in the light-emitting functional layers 130 may be separated from each other by the dam of the pixel defining layer PDL, or may be formed into a whole layer. The pixel defining layer PDL may be made of, for example, black polyimide, which is able to absorb light emitted from a light-emitting device M toward another adjacent light-emitting device M, so as to avoid light mixing of two adjacent sub-pixels.

As shown in FIG. 3, the flexible display panel 1 further includes an encapsulation layer 16 for encapsulating the light-emitting devices M. The encapsulation layer 16 may be encapsulation film(s). The number of encapsulation film(s) is not limited. In some embodiments, the encapsulation layer 16 may include an encapsulation film, or may include two or more encapsulation films that are stacked. For example, the encapsulation layer 16 includes three encapsulation films 161, 162 and 163 that are stacked in sequence.

In a case where the encapsulation layer 16 includes the three encapsulation films 161, 162 and 163 that are stacked in sequence, the encapsulation film 162 (i.e., an organic encapsulation film 162) located in the middle is made of an organic material, and the encapsulation films 161 and 162 respectively located on two sides of the encapsulation film 162 are each made of an inorganic material. The organic material is not limited, and may be, for example, polymethyl methacrylate (PMMA). Similarly, the inorganic material is not limited, and may be one or more of silicon nitride ($SiN_x$), silicon oxide ($SiO_x$) or silicon oxynitride ($SiO_xN_y$).

The gate lines G and the gates 171 of the thin film transistors in the pixel driving circuits 200 form a gate metal pattern layer 17. The data lines D, the voltage signal lines VDD, the signal leads 183, and sources 181 and drains 182 of the thin film transistors in the pixel driving circuits 200 form a source-drain metal pattern layer 18. Anodes of the light-emitting devices M form an anode metal pattern layer 19. The gate metal pattern layer 17, the source-drain metal pattern layer 18 and the anode metal pattern layer 19 are all made of metal materials, and thus may be collectively referred to as a metal material layer 03.

Gate insulating layers GI of the thin film transistors in the pixel driving circuits 200, the interlayer dielectric layer ILD, and the encapsulation films 161 and 163 are all made of inorganic materials, and thus may be collectively referred to as an inorganic material layer 02.

The flexible substrate 11, the back film 13, the adhesive layer 15, the first planarization layer PLN1, the second planarization layer PLN2, the pixel defining layer PDL, and the encapsulation film 162 are all made of organic materials, and thus may be collectively referred to as an organic material layer 01.

As shown in FIG. 3, in the metal material layer 03, the source-drain metal pattern layer 18 passes through the bending area B from the display area A, and extends to the bonding area C. For example, each signal lead 183 in the source-drain metal pattern layer 18 passes through the bending area B from the display area A, and extends to the bonding area C, so as to be electrically connected to a connector L.

In the inorganic material layer 02, the interlayer dielectric layer ILD passes through the bending area B from the display area A, and extends to the bonding area C. In order to reduce the overall thickness of the bending area B as much as possible, the thickness of a portion of the interlayer dielectric layer ILD at the bending area B is less than the thickness of a portion of the interlayer dielectric layer ILD in the display area A.

In the organic material layer 01, the flexible substrate 11 passes through the bending area B from the display area A, and extends to the bonding area C, so as to support a portion of the source-drain metal pattern layer 18 located at the bending area B and the bonding area C and a portion of the interlayer dielectric layer ILD located at the bending area B and the bonding area C.

It can be seen from the above that the signal leads 183 in the metal material layer 03 and the sources 181 and the drains 182 of the thin film transistors in the pixel driving circuits 200 are in a same layer, and are made of a same material, and the signal leads 183 need to pass through the bending area B to be respectively electrically connected to the connectors L located in the bonding area C. However, other metal pattern layer(s) in the metal material layer 03, such as the gate metal pattern layer 17 located between the source-drain metal pattern layer 18 and the flexible substrate 11, do not extend to the bending area B. Therefore, the source-drain metal pattern layer 18 has a level difference (i.e. a height difference) in a region between the display area A and the bending area B. For example, a distance between a surface, proximate to the flexible substrate 11, of a portion of the source-drain metal pattern layer 18 in the display area A and the first surface a is greater than a distance between a surface, proximate to the flexible substrate 11, of a portion of the source-drain metal pattern layer 18 at the bending area B and the first surface a. The signal lead 183 is prone to break at a position where the level difference exists.

However, since the interlayer dielectric layer ILD in the inorganic material layer 02 also extends to the bending area B, and the interlayer dielectric layer ILD has a certain thickness, the level difference in the region between the display area A and the bending area B may be reduced, and the breakages of the signal leads 183 at the position where the level difference exists are reduced. The portion of the interlayer dielectric layer ILD located at the bending area B may also support the signal leads 183 to a certain extent, and thus a bending resistance of the bending area B is improved.

In addition, the flexible display panel 1 needs to bend at the bending area B, so that the bonding area C is located on the non-light exit side (i.e., the back side) of the flexible display panel 1, thereby realizing the narrow bezel of the display device 100. When the flexible display panel 1 bends at the bending area B, outer film layer(s) are stretched and thus subjected to a tensile stress, and inner film layer(s) are compressed and thus subjected to a compressive stress. A transition film layer that is neither stretched nor compressed generally exists between the outer film layer(s) and the inner film layer(s), and the transition film layer is neither subjected to a tensile stress nor to a compressive stress. It will be noted that the transition film layer that is neither subjected to the tensile stress nor to the compressive stress is generally idealized. In some embodiments of the present disclosure, the compressive stress and the tensile stress to which the transition film layer is subjected are respectively less than the compressive stress and the tensile stress to which the outer film layer(s) or the inner film layer(s) are subjected.

It can be seen from the above that the signal leads 183 extend and pass through the bending area B, and may provide the data signal, the voltage signal and the gate driving signal from the driving IC and/or the FPC to the data lines D, the voltage signal lines VDD and the gate driving circuit 100', and thus the signal leads 183 play an important role in effective display of the display area A. Therefore, when the flexible display panel 1 bends at the bending area B, it should be ensured as much as possible that portions of the signal leads 183 at the bending area B are not broken. For this purpose, the portions of the signal leads 183 may be located in the transition film layer 10 at the bending area B. Otherwise, in the bending process at the bending area B, the signal leads 183 are likely to be subjected to stresses. If subjected to large stresses, the signal leads 183 are likely to be broken, which results in poor display of the display device 100.

As shown in FIG. 3, since the flexible display panel 1 is a top-emission display panel, the bonding area C is bent to a lower side (i.e., the non-light exit side of the flexible display panel 1) of the display area A through the bending area B. In this way, the outer film layer(s) are, for example, film layer(s) located in an upper portion of the bending area B shown in FIG. 3, and the inner film layer(s) are, for example, film layer(s) located in a lower portion of the bending area B shown in FIG. 3. In order to cause the portions of the signal leads 183 to be located in the transition film layer 10 at the bending area B, the thickness of film layer(s) located on an upper side of the signal leads 183 is required to be greater than or equal to the thickness of film layer(s) located on a lower side of the signal leads 183.

However, as shown in FIG. 3, in order to support the flexible substrate 11, the back film 13 and the adhesive layer 15 also pass through the bending area B from the display area A, and extend to the bonding area C. In addition, the flexible substrate 11 has a large thickness (e.g., may be about 100 microns), so that the thickness of the film layers located on the lower side of the signal leads 183 is large, and the upper side of the signal leads 183 is not provided with film layer(s) of a corresponding thickness. For this purpose, it is necessary to manufacture film layer(s) made of organic material(s) on the upper side of the signal leads 183 at the bending area B, so that at the bending area B, the thickness of the film layer(s) located on the upper side of the signal leads 183 is greater than or equal to the thickness of the film layers located on the lower side of the signal leads 183. However, in this way, the thickness of the film layer(s) located on the upper side of the signal leads 183 at the bending area B is also large, so that the thickness of a portion of the whole film layers located at the bending area B is larger, and thus the bending area B is difficult to bend.

For this purpose, as shown in FIG. 3, the flexible display panel 1 further includes a groove 14 located at the bending area B, so as to reduce the thickness of the film layers located on the lower side of the signal leads 183 at the bending area B. The groove 14 includes a bottom 141, and two side surfaces 142 arranged opposite to each other. The groove 14 is disposed in a side surface c of the back film 13 away from the flexible substrate 11, and the groove 14 does not penetrate through the back film 13. The groove 14 is located between the display area A and the bonding area C, and the two opposite side surfaces 142 of the groove 14 define the bending area B, but it is not limited thereto. The two opposite side surfaces 142 of the groove 14 may also exceed the bending area B, or be located within the bending area B.

As shown in FIG. 3, a distance d1 between the bottom 141 of the groove 14 and the first surface a of the flexible substrate 11 is a sum of the thickness of a portion of the back film 13, the thickness of the adhesive layer 15 and the thickness of the flexible substrate 11.

In the organic material layer 01, the first planarization layer PLN1, the second planarization layer PLN2, the pixel defining layer PDL, and the encapsulation film 162 are only located in the display area A, and these layers are collectively referred to as a first organic material layer 12a. Moreover, pattern layer(s) made of organic material(s) and located at the bending area B are collectively referred to as a second organic material layer 12b.

In some embodiments, at least one pattern layer in the second organic material layer 12b and corresponding pattern layer(s) for forming the first organic material layer 12a are in a same layer and made of a same material, and are manufactured by using a same patterning process.

In some embodiments, as shown in FIG. 3, the second organic material layer 12b includes a cover layer 123 and an anti-bending layer 122 located on a side of the cover layer 123 away from the flexible substrate 11. Hereinafter, unless otherwise specified, a description will be made in an example where pattern layer(s) included in the cover layer 123 and pattern layer(s) included in the first organic material layer 12a are in a same layer and made of a same material, and are manufactured by using a same patterning process, but is not limited thereto. The pattern layer(s) included in the cover layer 123 may be part of the pattern layers in the first organic material layer 12a. For example, the cover layer 123 may include at least one of a first planarization layer PLN1, a second planarization layer PLN2, a pixel defining layer PDL and an encapsulation film 162. It will be noted that in order to simplify the drawings, the pattern layer(s) in the cover layer 123 are not shown in detail in FIGS. 3 to 10.

The first organic material layer 12a and the second organic material layer 12b may be connected to form an integrative structure, or may have a certain gap therebetween, so as to separate the first organic material layer 12a and the second organic material layer 12b from each other. In a case where the first organic material layer 12a and the second organic material layer 12b are connected to form the integrative structure, the manufacturing process may be simplified without forming a gap between the first organic material layer 12a and the second organic material layer 12b. However, in a case where the gap is formed between the first organic material layer 12a and the second organic material layer 12b, if the flexible display panel 1 bends at the bending area B, only the second organic material layer 12b located at the bending area B is subjected to a stress (e.g., a tensile stress), and the first organic material layer 12a located in the display area A is not subjected to a stress. In this way, the first organic material layer 12a in the display area A may be protected from being deformed and broken, thereby ensuring a good display effect of the display device 100.

In order to describe the film layers in the display area A more clearly, in all the drawings, the film layers in the display area A are enlarged, so that an outermost surface of the display area A away from the flexible substrate 11 and an outermost surface of the bending area B away from the flexible substrate 11 have a large height difference therebetween. However, those skilled in the art will understand that in practical applications, the outermost surface of the bending area B away from the flexible substrate 11 is substantially flush with, or differs only in an order of micrometers from, the outermost surface of the display area A away from the flexible substrate 11.

The thickness d3 of the second organic material layer 12b is greater than or equal to the distance d1 between the bottom 141 of the groove 14 and the first surface a of the flexible substrate 11. For example, a ratio of the thickness d3 of the second organic material layer 12b to the distance d1 between the bottom 141 of the groove 14 and the first surface a of the flexible substrate 11 is in a range of 1:1 to 7:1, inclusive, so that the signal leads 183 are located in the transition film layer 10 at the bending area B, and thus the signal leads 183 are neither subjected to a tensile stress nor to a compressive stress in the bending process at the bending area B.

The position of the transition film layer 10 is not only related to the thickness of the film layer(s) located on an upper side of the transition film layer 10 and the thickness of the film layer(s) located on an lower side of the transition film layer 10, but also to an elastic modulus of a material located on the upper side of the transition film layer 10 and an elastic modulus of a material located on the lower side of the transition film layer 10. Since the portion of the interlayer dielectric layer ILD at the bending area B is located on the lower side of the signal leads 183, and an elastic modulus of the interlayer dielectric layer ILD is greater than an elastic modulus of the second organic material layer 12b (i.e., the interlayer dielectric layer ILD is less likely to be deformed than the second organic material layer 12b), in order to make the signal leads 183 located in the transition film layer 10, the thickness d3 of the second organic material layer 12b located on the upper side of the signal leads 183 is generally set to be large.

In a case where the ratio of the thickness d3 of the second organic material layer 12b to the distance d1 between the bottom 141 of the groove 14 and the first surface a of the flexible substrate 11 is less than 1:1, a portion of the flexible substrate 11 located at the bending area B is thick, and the anti-bending layer 122 is thin, which can not realize a good bending-resistant effect. In a case where the ratio of the thickness d3 of the second organic material layer 12b to the distance d1 between the bottom 141 of the groove 14 and the first surface a of the flexible substrate 11 is greater than 7:1, the portion of the flexible substrate 11 located at the bending area B is thin, so that a precision required by the process is high, and a yield is low. Therefore, the ratio of the thickness d3 of the second material layer 12b to the distance d1 between the bottom 141 of the groove 14 and the first surface a of the flexible substrate 11 is defined to be 1:1 to 7:1.

The second organic material layer 12b may include the anti-bending layer 122 or may not include the anti-bending layer 122. The anti-bending layer 122 may adjust the ratio of the thickness d3 of the second organic material layer 12b to the distance d1 between the bottom 141 of the groove 14 and the first surface a of the flexible substrate 11.

Referring to FIG. 3 again, it can be seen that the anti-bending layer 122 is located at the bending area B. In addition to balancing the relationship between the thickness d3 of the second organic material layer 12b and the distance d1 between the bottom 141 of the groove 14 and the first surface a of the flexible substrate 11, the anti-bending layer 122 disposed at the bending area B is able to further improve the bending resistance of the bending area B. A material of the anti-bending layer 122 includes one or more of polyimide (PI), an optically clear adhesive (OCA), an acrylic adhesive, a UV curable adhesive or a photoresist.

The anti-bending layer 122 is disposed on the side of the cover layer 123 away from the source-drain metal pattern layer 18, and may adjust stresses to which a portion of the inorganic material layer 02 (e.g., the interlayer dielectric layer ILD) and a portion of the metal material layer 03 (e.g., the signal leads 183) that are located at the bend area B are subjected in the bending process, so that the portion of the metal material layer 03 located at the bending area B is located in the transition film layer 10, so as to reduce a possibility that the portion of the metal material layer 03 located at the bending area B is broken in the bending process.

In a case where the anti-bending layer 122 is made of a PI material, the bending resistance of the bending area B is enhanced compared with the anti-bending layer 122 made of the UV curable adhesive. This is because the PI material has stable chemical properties and a high tensile strength compared with the UV curable adhesive, so that portions of the film layers (e.g., the interlayer dielectric layer ILD and the signal leads 183) at the bending area B are not easily broken in the bending process, thereby ensuring the reliability of the display device 100.

As shown in FIG. 3, the anti-bending layer 122 includes two side surfaces 122a arranged opposite to each other, and a first anti-bending surface 122b and a second anti-bending surface 122c arranged opposite to each other. The first anti-bending surface 122b is a surface of the anti-bending layer 122 proximate to the cover layer 123, and the second anti-bending surface 122c is a surface of the anti-bending layer 122 away from the cover layer 123.

An included angle θ2 between the side surface 122a of the anti-bending layer 122 and the first anti-bending surface 122b is greater than or equal to 20 degrees and less than 90 degrees. In a case where the included angle θ2 is controlled within the above range, it may be prevented that when a UV curable adhesive layer is manufactured by dispensing with a dispenser, an included angle θ2 between a side surface 122a and a first anti-bending surface 122b of an obtained anti-bending layer 122 is too small due to the fluidity of the UV curable adhesive (which causes a distance that the UV curable adhesive spreads beyond an edge of the bending area B is too long), which is not conducive to realizing the narrow bezel.

As shown in FIG. 3, an included angle θ3 between the side surface 122a and the second anti-bending surface 122c of the anti-bending layer 122 is a rounded angle. In this way, a surface shape and a bending curvature of the anti-bending layer 122 during the bending are able to be adapted to reduce a stress to which the second anti-bending surface 122c of the anti-bending layer 122 is subjected in the stretching process.

Figure 4:
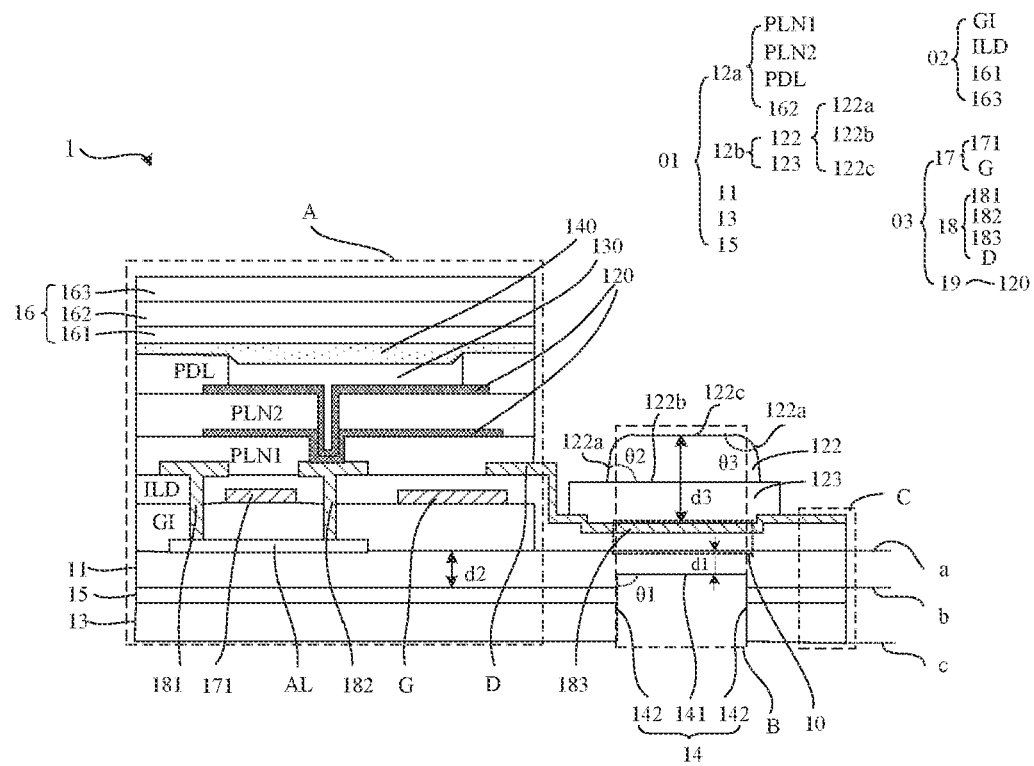
FIG. 4 is another sectional view of the flexible display panel shown in FIG. 2 taken along the H-H line.

In some other embodiments, as shown in FIG. 4, the groove 14 penetrates through a portion of the back film 13 located at the bending area B and a portion of the adhesive layer 15 located at the bending area B, but does not penetrate through the portion of the flexible substrate 11 located at the bending area B. The distance d1 between the bottom 141 of the groove 14 and the first surface a of the flexible substrate 11 is less than the thickness d2 of a portion of the flexible substrate 11 located in the display area A. In a case where the flexible display panel 1 includes the groove 14 as shown in FIG. 4, as shown in Table 1, simulation calculation results of a maximum equivalent stress of the portion of the inorganic material layer 02 (e.g., the interlayer dielectric layer ILD) located at the bending area B, a maximum equivalent stress of the portion of the metal material layer 03 (e.g., the signal leads 183) located at the bending area B, and a maximum equivalent stress of the portion of the whole film layers located at the bending area B each corresponding to UV curable adhesive layers with different thicknesses may be obtained through simulation calculation.

It can be seen from Table 1 that in the flexible display panel 1 shown in FIG. 3, the thickness of the UV curing adhesive layer is, for example, 100 microns, and in a bending process of the flexible display panel 1 shown in FIG. 4, the maximum equivalent stresses of the portion of the whole film layers located at the bending area B, the portion of the inorganic material layer 02 located at the bending area B, and the portion of the metal material layer 03 located at the bending area B are reduced, which indicates that the bending resistance of the bending area B in the bending process of the flexible display panel 1 is increased.

In addition, it can be also seen from Table 1 that the flexible display panel 1 shown in FIG. 3 needs a thick (e.g., 100 microns) UV curable adhesive layer to adjust positions of the portion of the inorganic material layer 02 and the portion of the metal material layer 03 that are located at the bending area B, and the flexible display panel 1 shown in FIG. 4 needs a small thickness of UV curable adhesive layer in the bending process. For example, in Table 1, in a case where the thickness of the anti-bending layer 122 composed of the UV curable adhesive layer is 10 microns, the maximum equivalent stress of the portion of the inorganic material layer 02 located at the bending area B is smallest, and the maximum equivalent stress of the portion of the metal material layer 03 located at the bending area B is smallest, and the bending resistance is best. Moreover, a thin anti-bending layer 122 may achieve a purpose of reducing the cost.

It can be seen from the above that the groove 14 penetrates through the portion of the back film 13 and the portion of the adhesive layer 15 that are located at the bending area B, and the thickness of the portion of the flexible substrate 11 located at the bending area B is reduced, so that a thick anti-bending layer 122 is not required to be disposed on the first surface a of the flexible substrate 11 when the positions of the portion of the inorganic material layer 02 and the portion of the metal material layer 03 that are located at the bending area B are adjusted. On one hand, stresses generated by the portion of the inorganic material layer 02 and the portion of the metal material layer 03 that are located at the bending area B in the bending process may be reduced, so as to improve the bending resistance. On another hand, the overall thickness of the bending area B is reduced, so that the bending area B is easy to bend, and the production cost is able to be reduced.

TABLE 1

| Thickness of the UV curable adhesive layer (unit: microns) | 0 | 5 | 10 | 100 |
|---|---|---|---|---|
| Maximum equivalent stress of the portion of the whole film layers located at the bending area (MPa) | 360.72 | 378.95 | 416.66 | 1432.2 |
| Maximum equivalent stress of the portion of the metal material layer located at the bending area (MPa) | 321.6 | 305.1 | 290.49 | 1422.8 |
| Maximum equivalent stress of the portion of the inorganic material layer located at the bending area (MPa) | 238.9 | 224.85 | 211.1 | 1423.2 |

Figure 5:
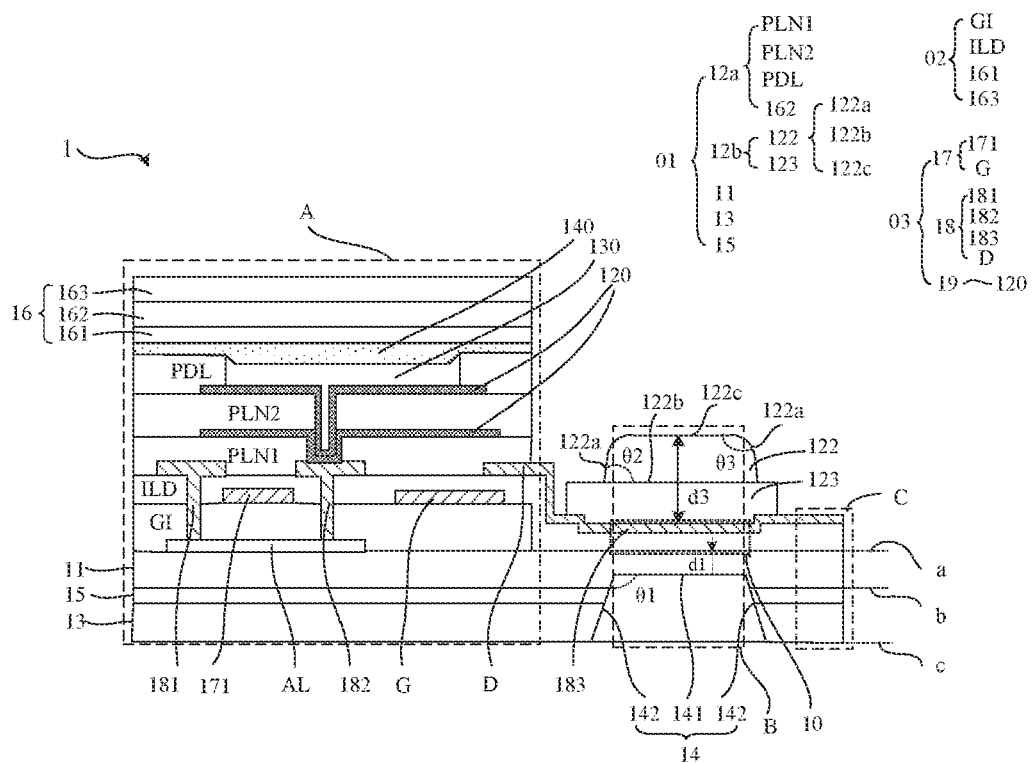
FIG. 5 is yet another sectional view of the flexible display panel shown in FIG. 2 taken along the H-H line.

In some embodiments, as shown in FIGS. 3 and 4, an included angle θ1 between each of at least one of the two opposite side surfaces 142 of the groove 14 and the bottom 141 of the groove 14 is equal to 90 degrees. In some other embodiments, as shown in FIG. 5, the included angle θ1 between each of the at least one of the two opposite side surfaces 142 of the groove 14 and the bottom 141 of the groove 14 is greater than 90 degrees. During bending at the bending area B, the included angle θ1 between the bottom 141 and each of the two side surfaces 142 of the groove 14 is also subjected to a compressive force. The included angle θ1 between the bottom 141 and each of the two side surfaces 142 of the groove 14 is set to be greater than or equal to 90 degrees, so that the compressive stress between the side surface 142 and the bottom 141 of the groove 14 is able to be reduced during bending at the bending area B, and thus the bending resistance of the bending area B is able to be further increased.

Figure 6:
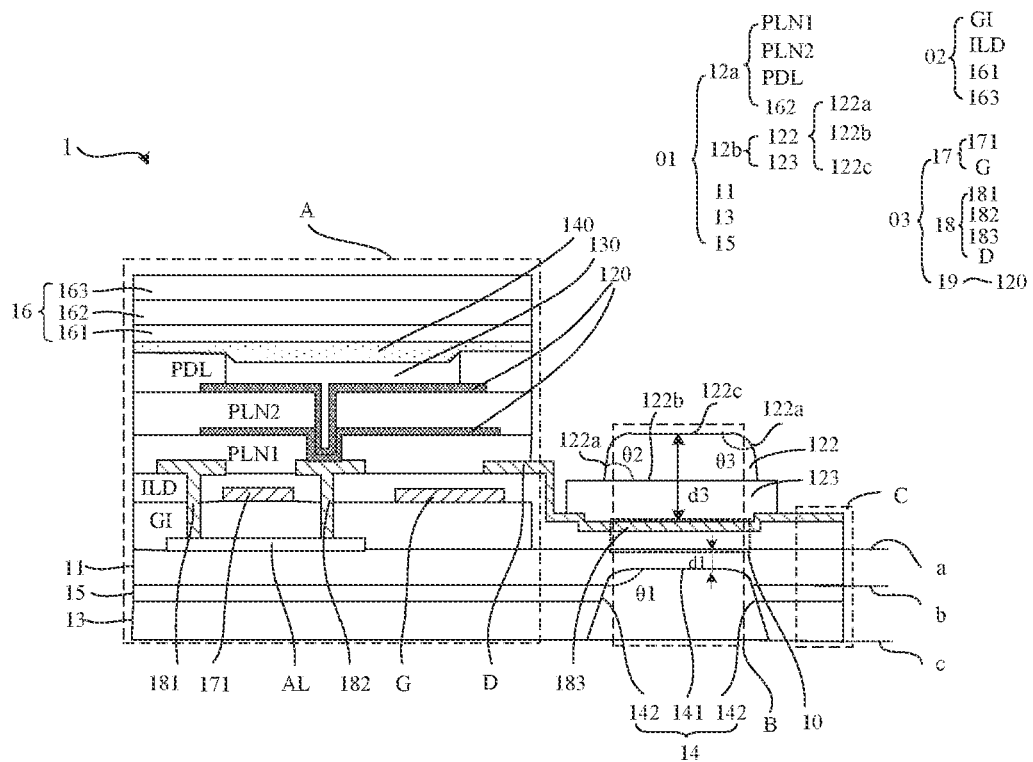
FIG. 6 is yet another sectional view of the flexible display panel shown in FIG. 2 taken along the H-H line.

In some other embodiments, as shown in FIG. 6, the included angle θ1 between each of at least one of the two opposite side surfaces 142 of the groove 14 and the bottom 141 of the groove 14 is a rounded angle, and a radius of the rounded angle is 250 to 600 microns.

In a case where the angle θ1 between the side surface 142 and the bottom 141 of the groove 14 is a rounded angle, as shown in Table 2, simulation calculation results of the maximum equivalent stress of the portion of the whole film layers located at the bending area B and the maximum equivalent stress of the portion of the metal material layer 03 (e.g., the signal leads 183) located at the bending area B at different radii are obtained through simulation calculation.

It can be seen from Table 2 that with the increase of the radius, the maximum equivalent stress of the portion of the whole film layers located at the bending area B and the maximum equivalent stress of the portion of the metal material layer 03 located at the bending area B each show a trend of increasing after decreasing. In a case where the radius is 350 microns, the maximum equivalent stress of the portion of the whole film layers located at the bending area B is smallest, and in a case where the radius is 450 microns, the maximum equivalent stress of the portion of the metal material layer 03 located at the bending area B is smallest. For example, in order to reduce the possibility that the portion of the metal material layer 03 (e.g., the signal leads 183) located at the bending area B is broken during bending at the bending area, the included angle θ1 between the side surface 142 and the bottom 141 of the groove 14 may be set as a rounded angle, and the radius of the rounded angle is 450 microns.

FIG. 6 exemplarily illustrates the included angle θ1 as a rounded angle when the included angle θ1 is greater than 90 degrees. It will be understood that the included angle θ1 may also be set as a rounded angle when the included angle θ1 is equal to 90 degrees. Technical effects are similar to the above, and will not be repeated here.

TABLE 2

| | Radius of the rounded angle (microns) | | | | | | |
| --- | --- | --- | --- | --- | --- | --- | --- |
| | 250 | 300 | 350 | 400 | 450 | 500 | 600 |
| Maximum equivalent stress of the portion of the whole film layers located at the bending area B (MPa) | 1338.7 | 1317.6 | 1310.4 | 1312.9 | 1322.5 | 1328.4 | 1350.2 |
| Maximum equivalent stress of the portion of the metal material layer located at the bending area B (MPa) | 1321.4 | 1294.5 | 1277.5 | 1270.3 | 1267.9 | 1272.9 | 1286 |

Figure 7:
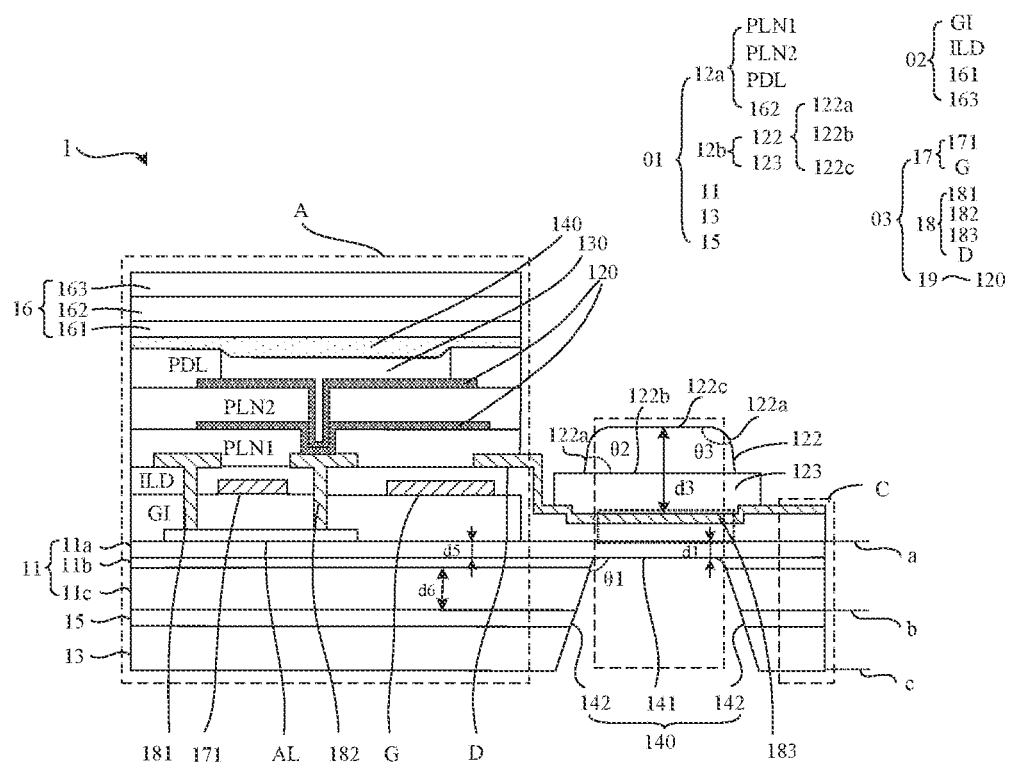
FIG. 7 is yet another sectional view of the flexible display panel shown in FIG. 2 taken along the H-H line.

The flexible display panel 1 shown in FIG. 3, 4, 5 or 6 is described in an example where the flexible substrate 11 (corresponding to a first flexible substrate 11a shown in FIG. 7) is of a single-layer structure. In some other embodiments, as shown in FIG. 7, the flexible substrate 11 includes the first flexible substrate 11a, a second flexible substrate 11b and a third flexible substrate 11c that are stacked in a thickness direction of the flexible substrate 11, and the third flexible substrate 11c is adhered to the adhesive layer 15. In this case, the first surface a of the flexible substrate 11 is a side surface of the first flexible substrate 11a away from the second flexible substrate 11b, and the second surface b of the flexible substrate 11 is a side surface of the third flexible substrate 11c away from the second flexible substrate 11b.

The first flexible substrate 11a and the third flexible substrate 11c are each composed of an organic material, and the second flexible substrate 11b is composed of an inorganic material. In the embodiments of the present disclosure, types of the organic material and the inorganic material here are not specifically limited, and the thicknesses of the first flexible substrate 11a, the second flexible substrate 11b, and the third flexible substrate 11c are not specifically limited, and may be the same or different.

The groove 14 penetrates through at least portions of the back film 13, the adhesive layer 15, the third flexible substrate 11c and the second flexible substrate 11b located at the bending area B. On this basis, the distance d1 between the bottom 141 of the groove 14 and the first surface a is less than or equal to the thickness d5 of the first flexible substrate 11a.

In a case where the distance d1 between the bottom 141 of the groove 14 and the first surface a is equal to the thickness d5 of the first flexible substrate 11a, as shown in FIG. 7, the groove 14 penetrates through the portions of the back film 13, the adhesive layer 15, the third flexible substrate 11c and the second flexible substrate 11b located at the bending area B, but does not penetrate into the first flexible substrate 11a. In a case where the distance d1 between the bottom 141 of the groove 14 and the first surface a is less than the thickness d5 of the first flexible substrate 11a, the groove 14 penetrates through the portions of the back film 13, the adhesive layer 15, the third flexible substrate 11c and the second flexible substrate 11b located at the bending area B, and penetrates into but does not penetrate through the first flexible substrate 11a. FIG. 7 exemplarily illustrates that the groove 14 does not penetrate into the first flexible substrate 11a.

The second flexible substrate 11b made of the inorganic material is disposed in the flexible substrate 11, and the second flexible substrate 11b is located at the display area A and the bonding area C, so that a support strength of the flexible substrate 11 at the display area A and the bonding area C is able to be significantly increased.

In some embodiments, the thicknesses of the first flexible substrate 11a and the third flexible substrate 11c are the same. In some other embodiments, the thicknesses of the first flexible substrate 11a and the third flexible substrate 11c are different. As shown in FIG. 7, the thickness d5 of the first flexible substrate 11a is less than the thickness d6 of the third flexible substrate 11c.

The thickness d5 of the first flexible substrate 11a is less than the thickness d6 of the third flexible substrate 11c, so that an operability of a process of reducing the thickness of the flexible substrate 11 is able to be increased, so as to reduce the thickness of the flexible substrate 11 to a maximum extent.

Figure 8:
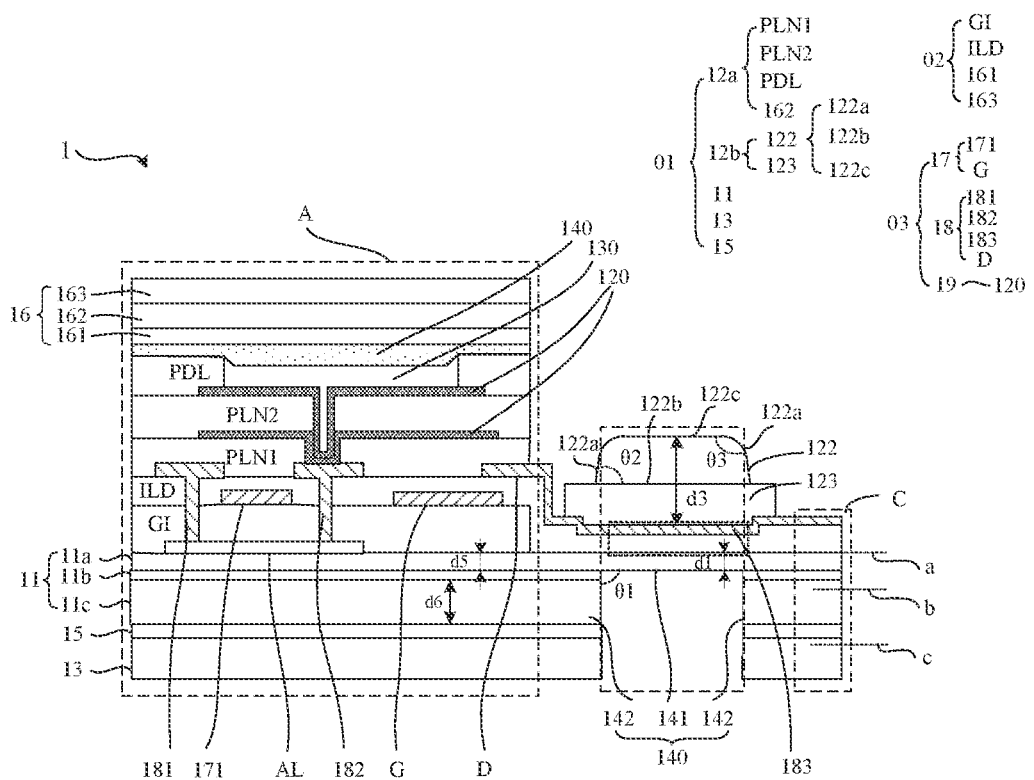
FIG. 8 is yet another sectional view of the flexible display panel shown in FIG. 2 taken along the H-H line.
Figure 9:
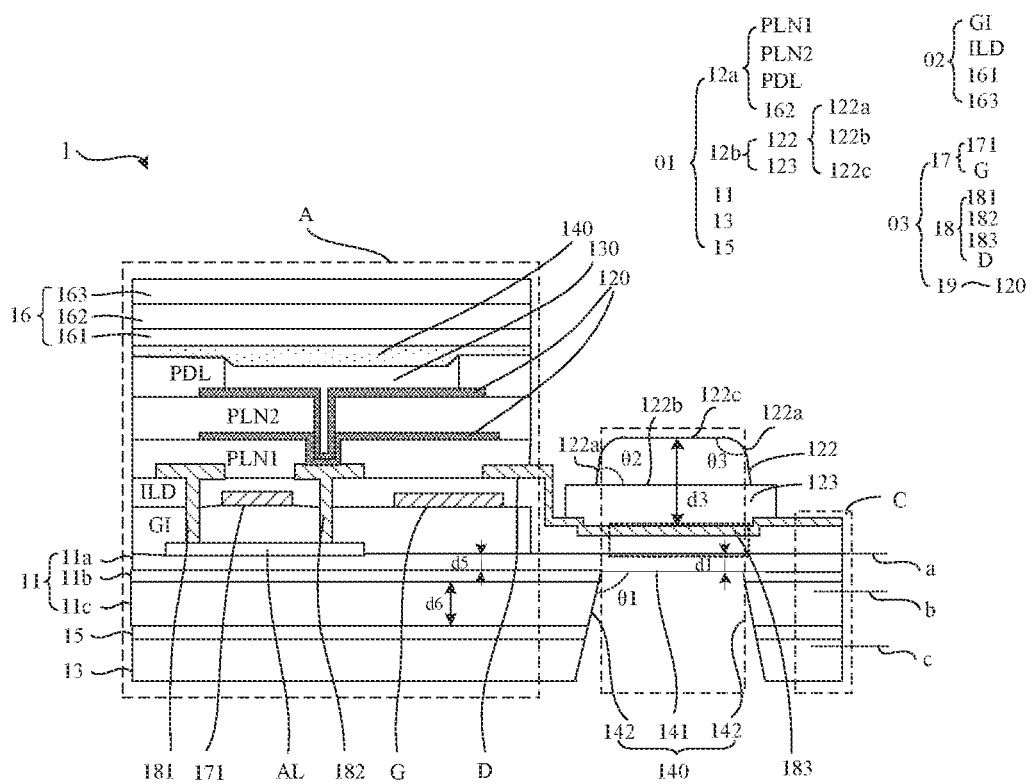
FIG. 9 is yet another sectional view of the flexible display panel shown in FIG. 2 taken along the H-H line.

As an example, the flexible substrate 11 of the three-layer structure shown in FIG. 7 is only applicable to the flexible display panel shown in FIG. 6. It will be understood that the flexible substrate 11 of the three-layer structure shown in FIG. 7 is also applicable to the flexible display panel shown in FIG. 4 or the flexible display panel 1 shown in FIG. 5, and technical effects are similar to the above, and will not be repeated here. For example, when the flexible substrate 11 of the three-layer structure is applied to the flexible display panel 1 shown in FIG. 4, a corresponding structure is shown in FIG. 8. When the flexible substrate 11 of the three-layer structure is applied to the flexible display panel 1 shown in FIG. 5, a corresponding structure is shown in FIG. 9.

Figure 10:
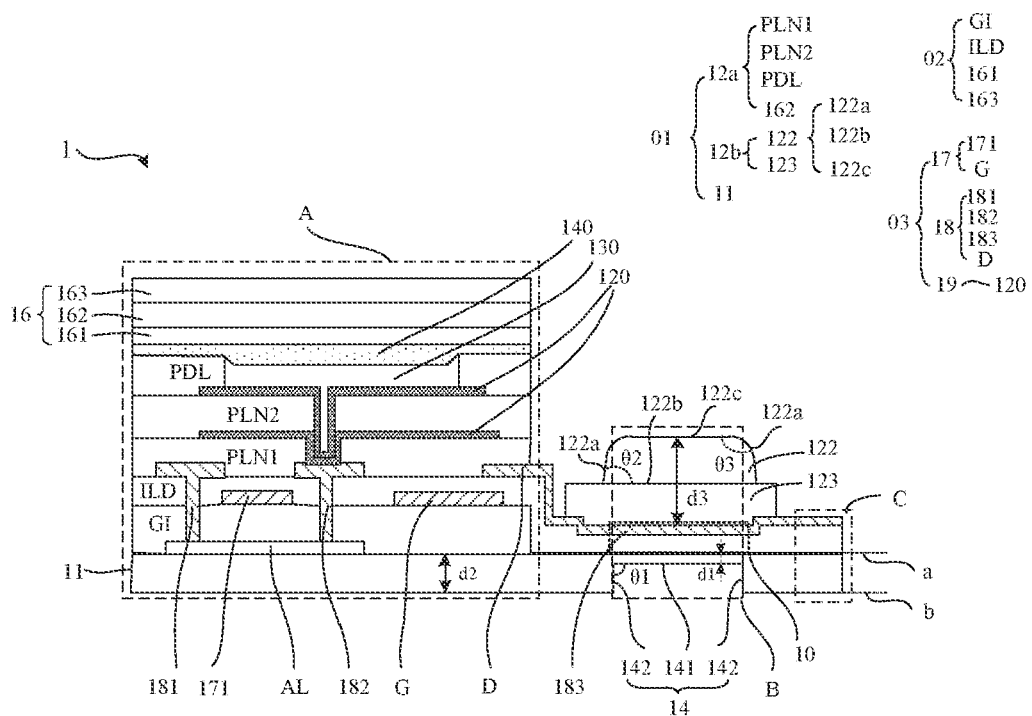
FIG. 10 is yet another sectional view of the flexible display panel shown in FIG. 2 taken along the H-H line.

In some embodiments, as shown in FIG. 10, the groove 14 is disposed in the second surface b of the flexible substrate 11, and the distance d1 between the bottom of the groove 14 and the first surface a of the flexible substrate 11 is less than the thickness d2 of the portion of the flexible substrate 11 located in the display area A. The back film 13 and the adhesive layer 15 for connecting the back film 13 and the flexible substrate 11 are not required to be disposed in the flexible display panel shown in FIG. 10, so as to simplify the process and reduce the cost.

Figure 11:
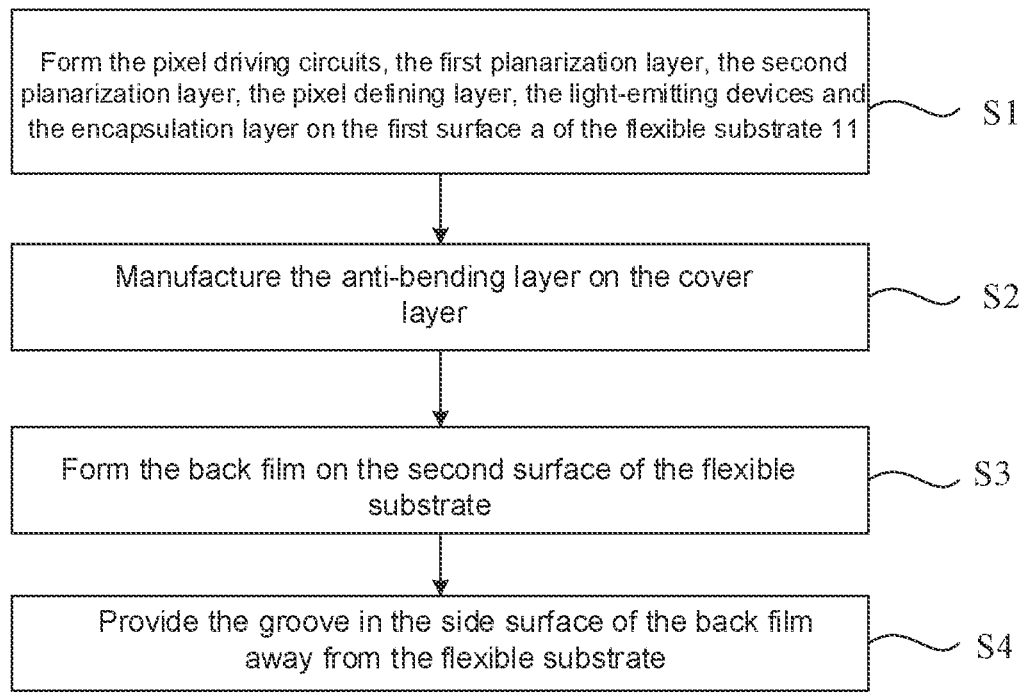
FIG. 11 is a flow diagram of a manufacturing method of a flexible display panel, in accordance with some embodiments.

Some embodiments of the present disclosure provide a manufacturing method of a flexible display panel 1, and the flexible display panel 1 is the above flexible display panel 1. As shown in FIG. 11 the manufacturing method of the flexible display panel 1 includes S1 to S4.

In S1, the pixel driving circuits 200, the first planarization layer PLN1, the second planarization layer PLN2, the pixel defining layer PDL, the light-emitting devices M and the encapsulation layer 16 are formed on the first surface a of the flexible substrate 11.

The interlayer dielectric layer ILD in the pixel driving circuits 200 passes through the bending area B from the display area A, and extends to the bonding area C. The signal leads 183 and the sources 181 and the drains 182 in the pixel driving circuits 200 are in a same layer and made of a same material, and are manufactured by using a same patterning process, and the signal leads 183 pass through the bending area B from the display area A, and extend to the bonding area C. The first organic material layer 12a is located in the display area A, and includes the first planarization layer PLN1 and the second planarization layer PLN2, the pixel defining layer PDL and the organic encapsulation film 162 in the encapsulation layer 16. The cover layer 123 is located at the bending area B, and at least one pattern layer in the cover layer 123 and a corresponding pattern layer included in the first organic material layer 12a are in a same layer and made of a same material, and are manufactured by using a same patterning process.

The flexible substrate 11 may be of the single-layer structure as shown in FIG. 3, 4, 5 or 6, or the three-layer structure (e.g., the first flexible substrate 11a, the second flexible substrate 11b and the third flexible substrate 11c that are stacked) as shown in FIG. 7, 8 or 9. A manufacturing method of the flexible substrate 11 is not limited in the embodiments of the present disclosure.

Figure 12:
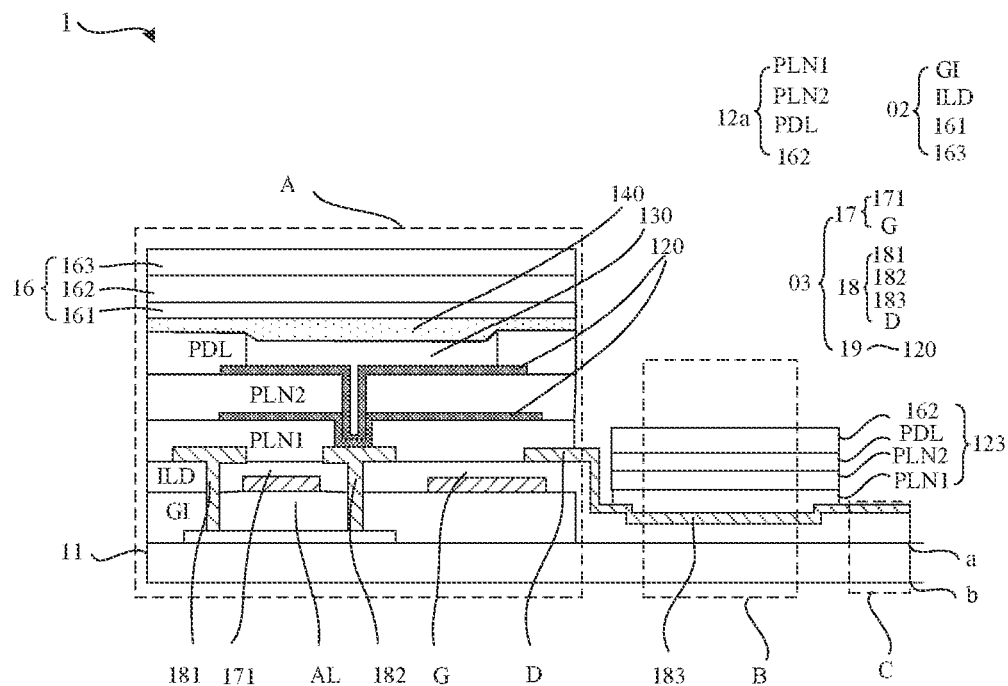
FIG. 12 is a diagram showing a process of a manufacturing method of a flexible display panel, in accordance with some embodiments.

As shown in FIG. 12, in a case where the cover layer 123 includes a first planarization layer PLN1, a second planarization layer PLN2, a pixel defining layer PDL and an encapsulation film 162, the first planarization layer PLN1 may be manufactured in the display area A and at the bending area B by one patterning process, the second planarization layer PLN2 may be manufactured in the display area A and at the bending area B by one patterning process, the pixel defining layer PDL may be manufactured in the display area A and at the bending area B by on patterning process, and the organic encapsulation film 162 may be formed in the display area A and at the bending area B by an ink-jet printing process. The first organic material layer 12a and the cover layer 123 may be connected to form an integrative structure, or may have a certain gap therebetween, so as to separate the first organic material layer 12a and the cover layer 123 from each other.

In S2, the anti-bending layer 122 is formed on the cover layer 123.

Figure 13:
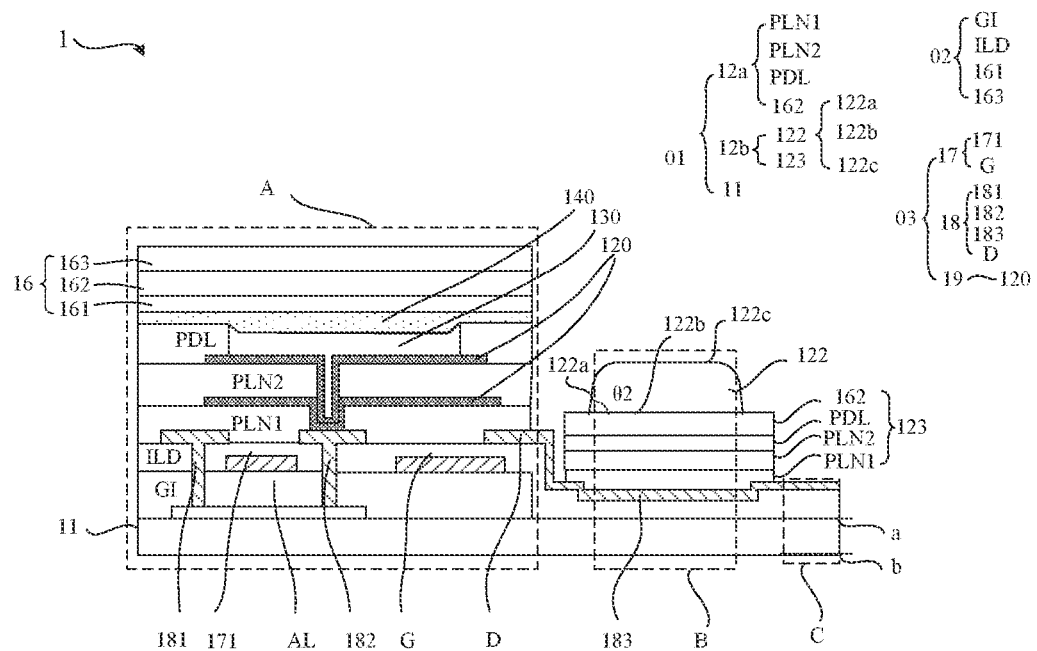
FIG. 13 is a diagram showing a process of a manufacturing method of a flexible display panel, in accordance with some embodiments.

In a case where the second organic material layer 12b further includes the anti-bending layer 122 located on the side of the cover layer 123 away from the flexible substrate 11, after the cover layer 123 is formed, as shown in FIG. 13, the anti-bending layer 122 is formed at the bending area B. In a case where the material of the anti-bending layer 122 includes any one of the PI material, the OCA, the photoresist, the acrylic adhesive or the UV curable adhesive, the anti-bending layer 122 may be manufactured by a photolithography process or an inkjet printing process. In some embodiments, the included angle θ2 between the side surface 122a of the anti-bending layer 122 and the first anti-bending surface 122b of the anti-bending layer 122 proximate to the flexible substrate 11 is greater than or equal to 20 degrees and less than 90 degrees.

It will be noted that in a case where the anti-bending layer 122 composed of the PI material or the OCA or the acrylic adhesive or the UV curable adhesive is manufactured by using the photolithography process, a photoresist layer is required to be formed on a side of a PI material layer or an OCA layer or an acrylic layer or a UV curable adhesive layer away from the flexible substrate 11, and then steps such as exposure, development, etching and peeling are performed. In a case where the anti-bending layer 122 is made of the photoresist, it is only necessary to expose and develop the photoresist, and the steps such as etching and peeling are not required. Therefore, the process of forming the anti-bending layer 122 by using the photoresist is more simple.

In some embodiments, the anti-bending layer 122 may also be formed by dispensing with a dispenser. The anti-bending layer 122 formed by using the photolithography process or the ink-jet printing process may be manufactured on a motherboard in a manufacturing process of the motherboard, which may save process time. Moreover, the anti-bending layer 122 is manufactured by the photolithography process or the inkjet printing process, which is able to improve a manufacturing accuracy, so as to solve a problem that an included angle between the side surface 122a of the obtained anti-bending layer 122 and the first anti-bending surface 122b of the anti-bending layer 122 proximate to the flexible substrate 11 is too small due to the fluidity of the adhesive (which causes a distance that the anti-bending layer 122 spreads beyond the edge of the bending area is too long), which is not conducive to realizing the narrow bezel.

The second organic material layer 12b includes the cover layer 123 and the anti-bending layer 122, and the second organic material 12b has the thickness d3.

In S3, the back film 13 is formed on the second surface b of the flexible substrate 11.

Figure 14:
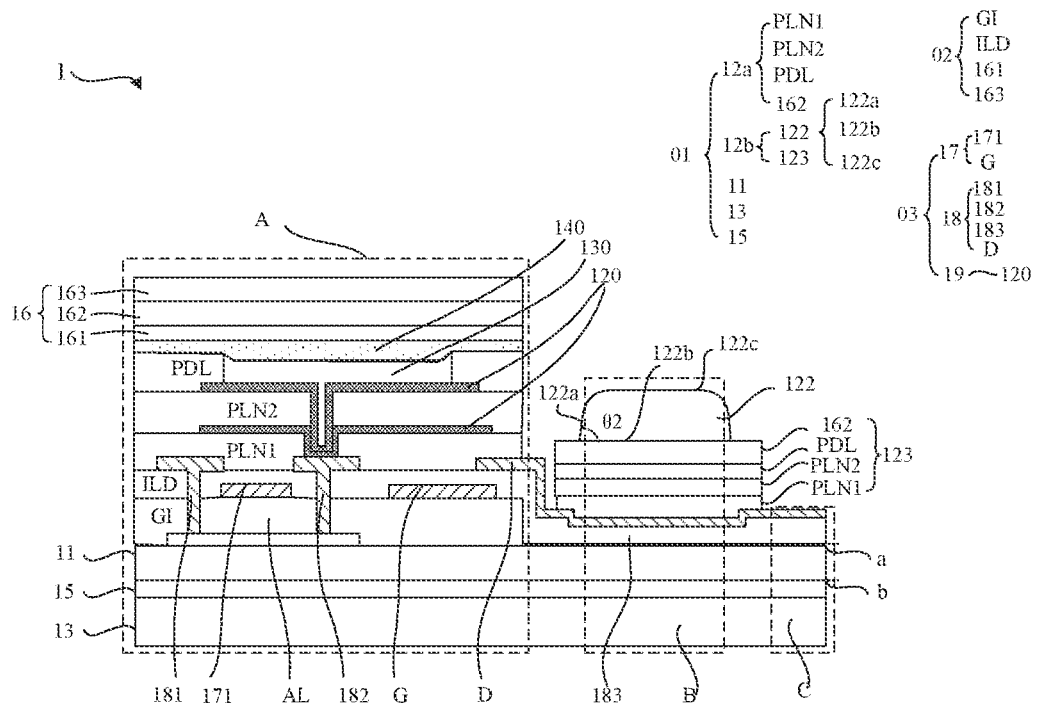
FIG. 14 is a diagram showing a process of a manufacturing method of a flexible display panel, in accordance with some embodiments.

As shown in FIG. 14, the back film 13 may be adhered to the second surface b of the flexible substrate 11 by using the adhesive layer 15, so as to form the back film 13 on the second surface b of the flexible substrate 11.

The constituent materials of the back film 13 and the adhesive layer 15 have been discussed above, and will not be repeated here. It will be noted that in some embodiments, S3 is not necessary. That is, in the flexible display panel 1, the back film 13 is not necessary. In a case where the backing film 13 is not necessary, the adhesive layer 15 is also not necessary.

It will be noted that the order of S2 and S3 is not limited in the embodiments of the present disclosure. For example, S2 may be performed first, i.e., the anti-bending layer 122 is manufactured on the cover layer 123, and then S3 is performed, i.e., the back film 13 is formed on the second surface b of the flexible substrate 11. For another example, S3 may be performed first, i.e., the back film 13 is formed on the second surface b of the flexible substrate 11, and then S2 is performed, i.e., the anti-bending layer 122 is manufactured on the cover layer 123.

In S4, the groove 14 is formed in the side surface c of the back film 13 away from the flexible substrate 11.

As described above, in a case where the back film 13 is not necessary, the groove 14 may be formed in the second surface b of the flexible substrate 11.

The groove 14 is located between the display area A and the bonding area C, and the two opposite side surfaces 142 of the groove 14 define the bending area B. The ratio of the thickness d3 of the second organic material layer 12b to the distance d1 between the bottom 141 of the groove 14 and the first surface a of the flexible substrate 11 is in a range of 1:1 to 7:1, inclusive.

The groove 14 may be formed in the side surface c of the back film 13 away from the flexible substrate 11 by a laser etching process.

Those skilled in the art will understand that various operations, methods, steps in flows, measures and solutions that have been discussed in the present disclosure may be replaced, modified, combined, or deleted without conflict. Further, various operations, methods, other steps in flows, measures and solutions that have been discussed in the present disclosure may also be replaced, modified, rearranged, decomposed, combined or deleted without conflict. Further, various operations, methods, steps in flows, measures and solutions in the prior art may also be replaced, modified, rearranged, decomposed, combined or deleted without conflicting with the present disclosure.

The above descriptions are merely specific implementation manners of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A flexible display panel having a display area, a bonding area and a bending area located between the display area and the bonding area; wherein
the flexible display panel comprises:
a flexible substrate including a first surface and a second surface arranged opposite to each other;
pixel driving circuits located on the first surface, wherein signal leads electrically connected to the pixel driving circuits pass through the bending area from the display area and extend to the bonding area, and in the pixel driving circuits, at least one pattern layer made of an inorganic material and located between the signal leads and the flexible substrate passes through the bending area from the display area and extends to the bonding area;
a first organic material layer including at least one of a first planarization layer, a second planarization layer, a pixel defining layer or an organic encapsulation film that are sequentially away from the first surface of the flexible substrate;
a second organic material layer disposed on a side of the signal leads away from the first surface and located at the bending area, the second organic material layer including a cover layer; and
a groove disposed in a film layer away from the signal leads and located on a side where the second surface is located, the groove being located between the display area and the bonding area; wherein
a ratio of a thickness of the second organic material layer to a distance between a bottom of the groove and the first surface of the flexible substrate is in a range of 1:1 to 7:1, inclusive;
the second organic material layer further includes an anti-bending layer located on a side of the cover layer away from the flexible substrate; and an included angle between a side surface of the anti-bending layer and a surface of the anti-bending layer proximate to the flexible substrate is greater than or equal to 20 degrees and less than 90 degrees; the first organic material layer is separated from the second organic material layer; an orthographic projection of the second organic material layer on the flexible substrate is located within an orthographic projection of the signal leads on the flexible substrate.

2. The flexible display panel according to claim 1, wherein
the groove is disposed in the second surface, and the distance between the bottom of the groove and the first surface of the flexible substrate is less than a thickness of a portion of the flexible substrate located in the display area.

3. The flexible display panel according to claim 1, further comprising a back film disposed on the second surface of the flexible substrate; wherein
the groove is disposed in a side surface of the back film away from the flexible substrate, penetrates through a portion of the back film located at the bending area, and does not penetrate through a portion of the flexible substrate located at the bending area, and the distance between the bottom of the groove and the first surface of the flexible substrate is less than a thickness of a portion of the flexible substrate located in the display area.

4. The flexible display panel according to claim 1, further comprising a back film disposed on the second surface of the flexible substrate; wherein
the groove is disposed in a side surface of the back film away from the flexible substrate, and does not penetrate through a portion of the back film located at the bending area.

5. The flexible display panel according to claim 1, wherein
the groove further includes two opposite side surfaces, and an included angle between each of at least one of the two opposite side surfaces and the bottom of the groove is greater than or equal to 90 degrees.

6. The flexible display panel according to claim 1, wherein
the groove further includes two opposite side surfaces, and an included angle between each of at least one of the two opposite side surfaces and the bottom of the groove is a rounded angle.

7. The flexible display panel according to claim 6, wherein a radius of the rounded angle is 250 to 600 microns.

8. The flexible display panel according to claim 2, wherein the flexible substrate includes a first flexible substrate, a second flexible substrate and a third flexible substrate that are stacked, and the first surface of the flexible substrate is a side surface of the first flexible substrate away from the second flexible substrate, and the second surface of the flexible substrate is a side surface of the third flexible substrate away from the second flexible substrate;
the distance between the bottom of the groove and the first surface of the flexible substrate is less than or equal to a thickness of a portion of the first flexible substrate located in the display area; wherein
the first flexible substrate and the third flexible substrate are each made of an organic material, and the second flexible substrate is made of an inorganic material.

9. The flexible display panel according to claim 8, wherein a thickness of the first flexible substrate is less than a thickness of the third flexible substrate.

10. The flexible display panel according to claim 4, wherein
the flexible substrate includes a first flexible substrate, a second flexible substrate and a third flexible substrate that are stacked, and the first surface of the flexible substrate is a side surface of the first flexible substrate away from the second flexible substrate, and the second surface of the flexible substrate is a side surface of the third flexible substrate away from the second flexible substrate;
the first flexible substrate and the third flexible substrate are each made of an organic material, and the second flexible substrate is made of an inorganic material.

11. The flexible display panel according to claim 1, wherein
a material of the anti-bending layer includes at least one of a polyimide material, an optically clear adhesive, an acrylic adhesive, a UV curable adhesive or a photoresist.

12. The flexible display panel according to claim 11, wherein the material of the anti-bending layer includes the polyimide material.

13. The flexible display panel according to claim 1, wherein
an included angle between the side surface of the anti-bending layer and a surface of the anti-bending layer away from the flexible substrate is a rounded angle.

14. A display device comprising the flexible display panel according to claim 1.

15. A manufacturing method of a flexible display panel, wherein the flexible display panel is the flexible display panel according to claim 1;
the manufacturing method comprising:
forming the pixel driving circuits and the signal leads electrically connected to the pixel driving circuits on the first surface of the flexible substrate, wherein the signal leads pass through the bending area from the display area and extend to the bonding area, and in the pixel driving circuits, at least one pattern layer made of an inorganic material and located between the signal leads and the flexible substrate passes through the bending area from the display area and extends to the bonding area;
forming the second organic material layer on the first surface of the flexible substrate, wherein the second organic material layer is disposed on the side of the signal leads away from the first surface and located at the bending area; and
forming the groove in the film layer away from the signal leads and located on the side where the second surface is located, the groove being located between the display area and the bonding area; wherein
the ratio of the thickness of the second organic material layer to the distance between the bottom of the groove and the first surface of the flexible substrate is in the range of 1:1 to 7:1, inclusive;
the flexible display panel further includes a first organic material layer, and the first organic material layer includes at least one of a first planarization layer, a second planarization layer, a pixel defining layer or an organic encapsulation film that are sequentially away from the first surface of the flexible substrate; the second organic material layer includes a cover layer;
the second organic material layer further includes an anti-bending layer located on a side of the cover layer away from the flexible substrate; forming the second organic material layer on the first surface of the flexible substrate further, includes:
forming the anti-bending layer on a surface of the cover layer away from the flexible substrate, an included angle between a side surface of the anti-bending layer and a surface of the anti-bending layer proximate to the flexible substrate being greater than or equal to 20 degrees and less than 90 degrees;
the first organic material layer is separated from the second organic material layer; an orthographic projection of the second organic material layer on the flexible substrate is located within an orthographic projection of the signal leads on the flexible substrate.

16. The manufacturing method of the flexible display panel according to claim 15, further comprising:
forming a back film on the second surface of the flexible substrate; wherein
forming the groove in the film layer away from the signal leads and located on the side where the second surface is located, includes: forming the groove in the back film, wherein the groove penetrates through a portion of the back film located at the bending area, and does not penetrate through a portion of the flexible substrate located at the bending area, or the groove does not penetrate through the portion of the back film located at the bending area.

17. The manufacturing method of the flexible display panel according to claim 15, wherein
forming the second organic material layer on the first surface of the flexible substrate, includes:
forming the at least one pattern layer in the cover layer and the corresponding pattern layer in the first organic material layer on the first surface of the flexible substrate through one patterning process.

* * * * *